United States Patent [19]

Hastings et al.

[11] 3,888,639

[45] June 10, 1975

[54] METHOD FOR CONNECTING PRINTED CIRCUITS

[75] Inventors: Myron L. Hastings, Hollis; Joseph P. Roberts, Hudson, both of N.H.

[73] Assignee: Teledyne Electro-Mechanisms, Nashua, N.H.

[22] Filed: Jan. 2, 1974

[21] Appl. No.: 429,917

[52] U.S. Cl. ................ 29/626; 29/470.5; 29/471.9; 29/472.3; 29/489; 29/625; 29/628; 174/68.5; 317/101 C; 317/101 CC; 317/101 CM

[51] Int. Cl. .............................................. H05k 3/34

[58] Field of Search ............................... 29/624–626, 29/470.5, 470.9, 471.9, 472.3, 484, 492, 493, 495, 498, 502, 489, 497.5, 628; 174/68.5; 317/101 C, 101 CC, 101 CM

[56] References Cited

UNITED STATES PATENTS

| | | | |
|---|---|---|---|
| 3,239,895 | 3/1966 | Stuckert | 29/626 UX |
| 3,296,099 | 1/1967 | Dinella | 29/62 UX |
| 3,500,538 | 3/1970 | Raciti | 29/489 X |
| 3,806,767 | 4/1974 | Lehrfeld | 317/101 CC |

*Primary Examiner*—C. W. Lanham
*Assistant Examiner*—Joseph A. Walkowski
*Attorney, Agent, or Firm*—Brumbaugh, Graves, Donohue & Raymond

[57] ABSTRACT

A method for electrically and mechanically connecting two printed circuit boards involves creating a first hole in the overcoat of the first circuit board at all points where electrical connection to the second circuit is desired. Then a second, smaller hole is made within the first hole, completely through the first circuit board. Next, the two circuits are juxtaposed, with the first above the second, and fastened together by an adhesive. A third hole, smaller than the second and located nearly concentric with the first and second holes, is then made through the second circuit board. Finally, the electrical and additional mechanical connection is made by inverting the combination and passing it over a solder wave of a wave soldering machine. During this process the third hole acts as a vent.

8 Claims, 2 Drawing Figures

METHOD FOR CONNECTING PRINTED CIRCUITS

BACKGROUND OF THE INVENTION

This invention relates to printed circuits and, more particularly, to a method for interconnecting printed circuits.

Generally, printed circuit layers are mechanically connected by fastening two circuits together in the proper relationship on a substrate with an adhesive. Electrical interconnections are then accomplished by various methods, such as punching holes through both printed circuit boards and plating through these holes to connect the conductor layers in the two printed circuits. Other methods involve the use of eyelets, tubelets, welding, brazing, etc., in the holes punched through the circuit boards. In still other processes, the connecting holes are filled with conductive material such as powdered metal (followed by sintering), metal paste or conducting paint.

All of these methods, however, are relatively expensive because either individual interconnections are required or additional steps, such as plating of circuit surfaces prior to external component assembly, are needed.

SUMMARY OF THE INVENTION

The present invention is directed toward overcoming the disadvantages and high expense associated with previous methods for electrically interconnecting printed circuits. This is accomplished by varying the diameters of the connecting holes with depth and establishing the electrical contact between the circuits during the soldering operation for the external circuit components.

In an illustrative embodiment of the invention, the first of the two printed circuits to be joined, has first holes created in it at all points where electrical connection to the second circuit is desired. This first hole penetrates only the insulation of the first circuit. Then a second hole, smaller than and nearly concentric with the first, is created through both the conductor and base insulation of the first circuit. Next, the two circuits are registered, with the first over the second, and mechanically joined to each other with an adhesive. A third hole, smaller than and generally concentric with both previous holes, is then punched completely through both circuit layers. Electrical interconnection is then established between the two printed circuits by inverting this combination and passing it over a solder wave, or by any other equivalent method of flowing solder into the interconnection areas. When external circuit components are to be attached to the circuits, their leads may be positioned through the interconnection holes or in other adjacent termination areas and then soldered in place during the interconnection soldering operation. During this soldering operation, the third hole acts as a vent which aids the flow of solder into the holes.

BRIEF DESCRIPTION OF THE DRAWINGS

The foregoing and other features of the present invention will be more readily apparent from the following detailed description and drawings, in which.

DESCRIPTION OF THE PREFERRED EMBODIMENTS

Figure 1:
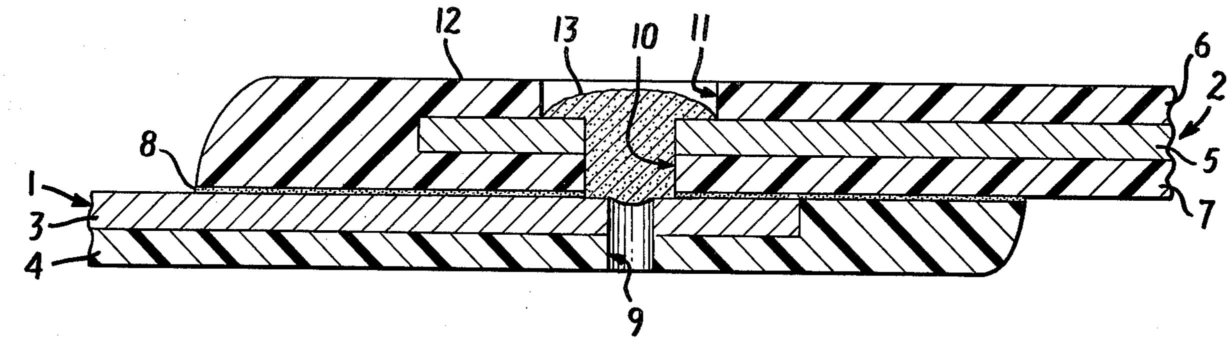
FIG. 1 is a side sectional view of two flexible printed circuits joined according to the method of the present invention.
Figure 2:
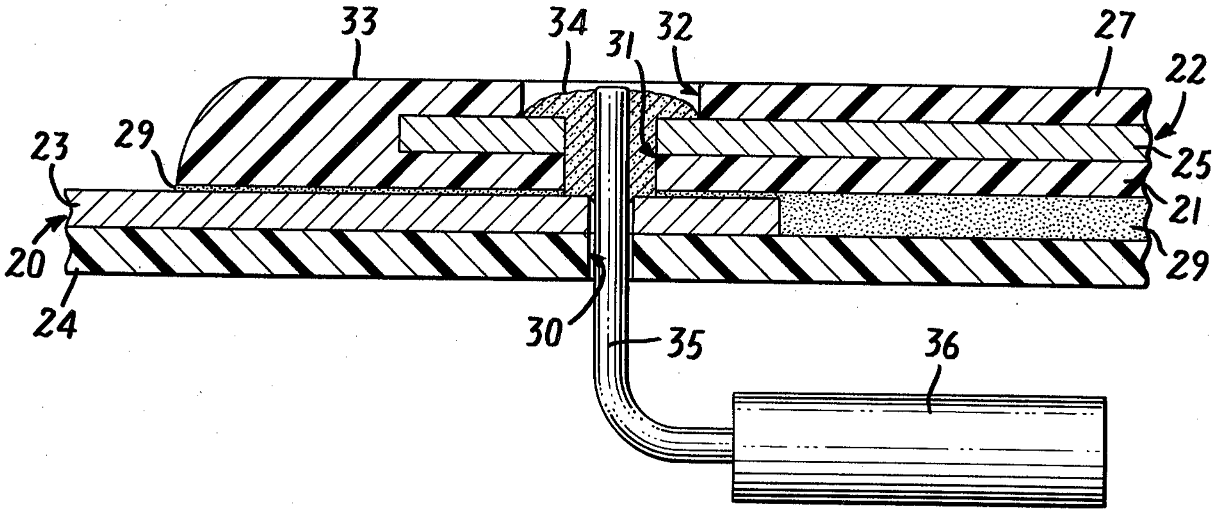
FIG. 2 is a side sectional view of a flexible printed circuit joined to a hardboard printed circuit according to the method of the present invention.

Two flexible printed ciruits, 1 and 2, are shown in FIG. 1. It should be noted that the dimensions in FIGS. 1 and 2 are not necessarily drawn to scale, but are exaggerated in the interests of clarity. The flexible printed circuits 1 and 2 contain conductor planes 3 and 5, respectively, and flexible substrates of insulating material 4 and 7, respectively. In order to protect the surface of conductor 5, a flexible insulating overcoat 6 covers it.

To establish electrical interconnection between conductor plane 5 of printed circuit 2 and conductor plane 3 of printed circuit 1, and also to provide a better mechanical connection, printed circuit 2 is constructed with opening 11 in overcoat 6, using standard fabrication techniques, such as milling. Next a hole 10, substantially concentric with opening 11 and slightly smaller, is punched through conductor 5 and insulation 7 of circuit 2. Circuit 2 is then mechanically connected to circuit 1 by means of a suitable adhesive 8. However, prior to joining the printed circuits with adhesive they are registered with respect to one another according to some predetermined plan for establishing an electrical connection between them. The adhesive 8 may be of any suitable type, such as a thermo-setting or pressure sensitive adhesive.

Next, a hole 9, concentric with the previous two holes and smaller than both is punched through conductor 3 and insulation 4. Finally, the joined flexible circuits are inverted from the position shown in FIG. 1 and the surface 12 of circuit 2 is immersed in or passed through a solder wave produced by a conventional wave soldering machine. This causes the solder 13 to flow into the larger opening 11 and then to pass up into opening 10 by capillary action, thereby establishing electrical contact between conductors 3 and 5. The opening 9 serves as a vent during the soldering process and permits the escape of air which enables the solder to flow into the openings and connect the conductors. To minimize the possibility of oxidation of the interconnection surfaces prior to forming the interconnections, the printed circuit layers may be pretinned during their construction. Also, other holes, such as 9, 10 and 11, can be made on the two circuit boards at other points where a connection between them is desired (not shown).

In FIG. 2 there is shown a rigid or hardboard printed circuit 20 connected to a flexible printed circuit 22 by an adhesive 29. It should be noted that FIG. 2 is not drawn to scale and certain dimensions have been exaggerated in the interest of clarity.

The hardboard printed circuit 20 has a rigid substrate 24 on which is located a printed circuit conductor 23. The flexible printed circuit 22 is the same as circuit 2 in FIG. 1 and consists of a conductor plane 25 sandwiched between a flexible insulating substrate 21 and a flexible insulating overcoat 27. As with the method described in relation to FIG. 1, a first opening 32 is made through the overcoat 27 of flexible circuit board 22 by conventional techniques, e.g., punching or milling. Then, a second slightly smaller opening 31 is made through conductor 25 and substrate 21, within the confines of hole 32. Next, the two circuits are registered with respect to each other and joined by adhesive 29. A third opening 30, which is smaller than hole 31, is then punched through circuit board 20 at a point nearly concentric with holes 31 and 32. Sets of holes, such as 30, 31 and 32, can be made at any point on the circuit boards where electrical connection between the two conductors, 23 and 25, is desired or where it is desired to connect an external circuit element 36 to one or both of the conductors. When such an external component is to be connected the opening 30 should be large enough to easily accept a lead 35 of the component 36. Following the mechanical connection of circuits 20 and 22 with a suitable adhesive and the mounting of any external components, the assembly is inverted from the position shown in FIG. 2 and the surface 33 of the flexible circuit is immersed in or passed through a solder wave. This will establish electrical and additional mechanical connection between the circuits and will secure any external components in place.

To make sure that solder will flow into openings 32 and 31, in FIG. 2, or openings 10 and 11 of FIG. 1, these holes should be of sufficient diamter. By way of example, electrical contact was established between printed circuits when the largest opening was 0.093 mils, the middle-sized opening was 0.062 mils, and the smallest opening was 0.031 mils.

While the invention has been particularly shown and described with reference to preferred embodiment thereof, it will be understood by those skilled in the art that various changes in form and details may be made therein without departing from the spirit and scope of the invention. For example, the method of the present invention could be used to electrically interconnect two rigid circuit boards and also more than two circuits could be joined together by the proper sizing of the openings at the connecting points.

We claim:

1. The method of connecting at least a first and second printed electrical circuit, each having at least one conductor plane in the form of a printed circuit configuration and one supporting substrate for the conductor plane, comprising the steps of:

creating at least a first hole in said first printed circuit at a location where a connection to at least one of the conductor planes is desired, said first hole passing only through to the conductor plane of said first printed circuit;

creating at least a second hole substantially concentric with said first hole, said second hole being slightly smaller than said first hole and passing completely through said first printed circuit;

applying an adhesive to at least one of said printed circuits;

registering the other printed circuit with respect to the one;

bringing the other printed circuit into contact with the adhesive;

creating at least a third hole, substantially concentric with and smaller than the second hole, through said second printed circuit; and applying molten solder to the side of said first printed circuit having the first hole in it, thereby mechanically securing said printed circuits together and electrically connecting their conductor planes to each other.

2. The method of claim 1 in which the step of applying molten solder comprises passing the side of said first printed circuit having the first hole through a solder wave formed by a wave soldering machine.

3. The method of claim 1 in which a plurality of sets of concentric first, second, and third holes are formed, each set of concentric holes being formed at each location where a connection to at least one of the conductor planes is desired.

4. The method of claim 1 in which portions of a plurality of circuit boards are connected together.

5. The method of claim 1 further including the step of inserting leads of external circuit components into termination openings prior to the step of applying molten solder.

6. The method of claim 1 in which said first and second printed circuits are flexible printed circuits.

7. The method of claim 1 in which said first printed circuit is a flexible printed circuit having a conductor plane located between two flexible insulating substrates and said second printed circuit is a rigid printed circuit having a conductor plane located on a rigid insulating substrate.

8. The method of claim 1 further including the step of pre-tinning selected conductor surfaces of the printed circuits, prior to the step of applying an adhesive.

* * * * *